United States Patent
Shiobara et al.

(10) Patent No.: US 7,056,772 B2
(45) Date of Patent: Jun. 6, 2006

(54) METHOD FOR SEALING SEMICONDUCTOR COMPONENT

(75) Inventors: Toshio Shiobara, Gunma-ken (JP); Tsutomu Kashiwagi, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/885,678

(22) Filed: Jul. 8, 2004

(65) Prior Publication Data
US 2005/0009244 A1    Jan. 13, 2005

(30) Foreign Application Priority Data
Jul. 9, 2003    (JP) .............................. 2003-194402

(51) Int. Cl.
*H01L 21/48*    (2006.01)

(52) U.S. Cl. ...................... 438/127; 438/106; 438/110; 438/112; 438/725; 438/65; 438/264

(58) Field of Classification Search ................ 438/106, 438/110, 112, 127, 725, 65, 264
See application file for complete search history.

(56) References Cited

U.S. PATENT DOCUMENTS 5,976,912 A * 11/1999 Fukutomi et al. ............ 438/110
2004/0174406 A1 * 9/2004 Igarashi et al. ............... 347/20

OTHER PUBLICATIONS

Encyclopedia search for epoxy at www.answer.com*
Epoxy Resin Handbook, Nikkan Kogyo News Paper Co., Ltd., pp. 477-484.
"Epoxy Resin Handbook," Nikkan Kogyo Newspaper Co., Ltd., pp. 477-484.

* cited by examiner

*Primary Examiner*—W. David Coleman
*Assistant Examiner*—Su C. Kim

(57) ABSTRACT

In connection with a semiconductor component having a circuit region and electrodes formed on a substrate surface, the circuit region is sealed by (1) applying a resist material onto the substrate surface to form a resist layer, (2) selectively exposing the resist layer to radiation and developing the resist with a liquid developer for thereby removing only the portion of the resist layer which overlies the circuit region, (3) applying a resin sealant onto the circuit region and curing the resin sealant into a cured resin layer that covers the circuit region, and (4) removing the residual resist layer using a solvent.

14 Claims, 5 Drawing Sheets

METHOD FOR SEALING SEMICONDUCTOR COMPONENT

This Non-provisional application claims priority under 35 U.S.C. § 119(a) on Patent Application No(s). 2003-194402 filed in Japan on Jul. 9, 2003, the entire contents of which are hereby incorporated by reference.

TECHNICAL FIELD

This invention relates to a method for sealing a semiconductor component comprising a substrate and at least one circuit region and electrodes formed on a surface thereof, the circuit region being sealed with a resin. As used herein, the term "semiconductor component" refers to optical semiconductor components as well as ordinary semiconductor components.

BACKGROUND ART

A traditional method of sealing the surface of a semiconductor component directly with a transparent resin involves using a photosensitive transparent resin, and exposing the resin to radiation through a photomask. The photosensitive resins commonly used in this method are acrylic-modified silicone resin compositions and silicone resin compositions that make use of photo-induced cationic polymerization. The materials of these types are transparent, but raise some problems when used for semiconductor component sealing. The acrylic-modified silicone resin compositions have poor heat resistance, so that they are likely to discolor on long-term use at elevated temperatures or under ultraviolet exposure. In the event that makes use of photo-induced cationic polymerization, the catalysts capable of generating cations upon light exposure contain many ionic impurities, most of which cause electrodes of aluminum or the like to be readily corroded.

On the other hand, thermosetting and room temperature curable silicone resin compositions are also used for the sealing of semiconductor components because they have a high purity and heat resistance as well as transparency and good adhesion. However, the materials of these types cannot be used when it is desired to seal only selected portions by direct imagewise processing of the material using radiation, typically ultraviolet radiation.

For the technology to which the present invention relates, reference is made to Epoxy Resin Handbook, pages 477–484, Nikkan Kogyo Newspaper Co., Ltd.

SUMMARY OF THE INVENTION

An object of the present invention is to provide a method for sealing a semiconductor component having a circuit region on a substrate, which method is capable of sealing the circuit region with an organic resin sealant having heat resistance, transparency and good adhesion through selective direct imagewise processing.

With respect to the resin sealing of a circuit region formed on a substrate, the inventor has found that only the circuit region can be sealed with a resin sealant by applying a resist material to the substrate surface to form a resist layer, selectively exposing the resist layer to radiation and developing the resist layer for removing only the portion of the resist layer which corresponds to the circuit region, then applying a resin sealant to the circuit region and curing the resin sealant, and finally removing the residual resist layer.

Then the surface of a semiconductor component can be sealed using an organic resin sealant having heat resistance, transparency and good adhesion which is prohibited from use in the prior art.

The inventive method enables sealing at a level of several ten microns and allows for use of curable organic resin compositions having transparency and good adhesion such as silicone and epoxy resin compositions. During the long-term service, optical devices such as UV LED and blue LED sealed therewith experience only a little drop of transmittance.

The present invention provides a method for sealing a semiconductor component comprising a substrate and at least one circuit region and electrodes formed on a surface thereof, the circuit region being sealed with a resin. The method comprises the steps of:

(1) applying a resist material onto the substrate surface where the circuit and electrodes are formed, to form a resist layer, (2) selectively exposing the resist layer to radiation and developing the resist layer with a liquid developer such that only the portion of the resist layer which overlies the circuit region is removed, (3) applying a resin sealant onto the circuit region which is exposed as a result of selective removal of the resist layer and curing the resin sealant into a cured resin layer that covers the circuit region, and (4) removing the residual resist layer using a solvent which can dissolve the resist, but not the cured resin layer.

In one embodiment wherein the resist material is a positive resist material, only an exposed portion of the resist layer becomes dissolvable with the developer. In another embodiment wherein the resist material is a negative resist material, only an unexposed portion of the resist layer is dissolvable with the developer.

In a typical embodiment, the semiconductor component has a plurality of circuit regions and electrodes formed thereon. After step (4), the substrate is cut into discrete chips each bearing an individual resin-sealed circuit region.

The resin sealant is preferably a silicone or epoxy resin composition, which may contain an inorganic phosphor and/or a light scattering agent. Also preferably, the resin sealant is transparent.

The singular forms "a", "an" and "the" include plural referents unless the context clearly dictates otherwise.

DESCRIPTION OF THE PREFERRED EMBODIMENTS

Figure 1:
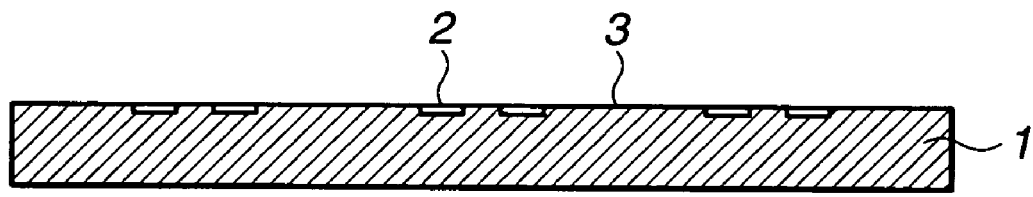
FIG. 1 is a schematic cross-sectional view of a semiconductor component substrate used in one embodiment of the invention.

The invention pertains to a method for sealing or encapsulating a semiconductor component comprising a substrate and at least one circuit region and electrodes (connected to the circuit) formed on a surface thereof. Specifically, the circuit region of the semiconductor component is sealed with a resin. The method starts with the step (1) of applying a resist material onto the substrate surface where the circuit and electrodes are formed, to form a resist layer.

The resist material used herein may be either positive or negative. Use may be made of well-known resist materials, for example, resist materials adapted for i- and g-line exposure, comprising an alkali soluble novolac resin and a photosensitive agent in the form of a quinonediazide such as naphthoquinonediazidosulfonyl chloride and chemically amplified resist materials. Commercial products may also be used as the resist material. The semiconductor components (inclusive of optical semiconductor components) to which the present invention is applicable include UV LED, blue LED, visible light LED, IR LED and laser LED. The substrates include those of silicon, gallium arsenide, gallium aluminum arsenide, gallium phosphide and sapphire.

When the resist material is applied onto the substrate surface, it is preferred to form a coating of the resist material to a thickness of about 5 to 100 μm, more preferably about 10 to 50 μm. A coating thickness of less than 5 μm may fail to allow the semiconductor component to be subsequently coated and sealed with an organic resin sealant having a sufficient thickness to ensure reliability. A coating thickness of more than 100 μm is difficult to achieve with a currently available resist material.

The resist material may be applied by any desired techniques such as spin coating and screen printing.

Once the resist material is applied, it is dried and optionally pre-baked at 60 to 200° C. for about 10 seconds to 10 minutes.

Next step (2) is by selectively exposing the resist layer to radiation through a photomask and developing the resist layer with a liquid developer such that only the portion of the resist layer which overlies the circuit region (to be resin sealed) is removed.

In the event the resist material is positive, only the portion of the resist layer corresponding to the region to be sealed is exposed to radiation. Inversely, in the event the resist material is negative, only the portion of the resist layer corresponding to the region not to be sealed is exposed to radiation. The invention enables to seal a region of any size as long as the size of a light-shielding zone is adjusted to match with the size of the region to be sealed. When the sealed substrate is finally diced into discrete chips, the spacing between light-shielding zones should have a necessary width to allow for such dicing operation.

Upon light exposure, the wavelength is suitably selected depending on a particular type of resist material used. In general, the radiation used for exposure has a wavelength of less than about 400 nm, for example, UV radiation, deep UV, excimer laser light, x-rays, and electron beams. Most often, exposure is made in a well-known manner using i-line, g-line, or emissions of excimer lasers such as KrF and ArF lasers.

Following the light exposure, the resist layer is optionally baked (post-exposure baked) at 40 to 150° C. for about 10 seconds to 5 minutes and then developed with a liquid developer. Where the resist material is positive, a developer capable of dissolving only an exposed portion, but not an unexposed portion of the resist layer is used. For a negative resist material, a developer capable of dissolving only an unexposed portion, but not an exposed portion of the resist layer is used. In either case, a choice may be made among well-known developers. For example, use may be made of well-known alkali developers in the form of 0.1 to 5% solutions of tetramethylammonium hydroxide. The development may be carried out in accordance with a well-known procedure and conditions.

Next step (3) is by applying an organic resin sealant onto the circuit region which is exposed as a result of step (2), that is, selective exposure, development and removal of the resist layer, and curing the resin sealant into a cured resin layer that covers the circuit region.

The organic resin sealant used herein is preferably a curable organic resin composition though not limited thereto. Typical curable organic resin compositions include silicone resin compositions and epoxy resin compositions.

The preferred silicone resin compositions used herein include compositions of the heat cure type (addition cure type) in which a vinyl-containing organopolysiloxane is reacted with a hydrosilyl-containing organopolysiloxane in the presence of a platinum catalyst, and compositions of the room temperature cure type in which an organopolysiloxane having silanol or alkoxy groups, preferably at molecular chain ends, undergoes condensation reaction in the presence of a condensation catalyst.

Any epoxy resin composition may be used herein. Epoxy resin compositions comprising an epoxy resin and an acid anhydride curing agent, and homopolymers of self-polymerizable epoxy resins are desired because they can maintain transparency after curing.

Where optical devices such as LED are to be sealed, it is preferred to use curable organic resin compositions which cure into transparent products. A favorable choice may be made among curable silicone resin compositions which are transparent to a wavelength of at least 350 nm and transparent epoxy resin compositions in which alicyclic epoxy resins are cured with acid anhydrides.

Insofar as the objects of the invention are not compromised, these curable organic resin compositions may further contain inorganic fillers such as silica for adjusting a coefficient of expansion. Similarly, light scattering agents and inorganic phosphors may be added when optical devices like LED are to be sealed.

For the application of the curable organic resin compositions, spin coating and printing techniques may be employed. The application of such a composition is preferably limited to the circuit region of the semiconductor component. When the spin coating technique is used, the sealant will flow into the circuit region which takes the form of a recess in the resist layer after the selected portion thereof is removed, and the sealant on the remaining portion of the resist layer is, in fact, spin off so that no sealant is left on the resist layer.

An undesirable problem arises if the curable organic resin composition is applied without optimizing a coating build-up. This situation suggests that the curable organic resin composition is then cured with a substantial amount thereof being deposited on the resist layer. In the subsequent step of removing the remaining resist layer, the cured resin which has been on the resist layer is left behind. Only the resist layer is removed, and this portion becomes a cavity below the cured resin. For this reason, the coating build-up of the curable organic resin composition should desirably be adjusted to the same thickness as the resist layer so that at the end of application, a coating of the curable organic resin composition is flush with the resist layer. Particularly in the case of spin coating, it is desirable to select an optimum spin rate to match with the viscosity of the curable organic resin composition.

The curing procedure and conditions for the curable organic resin composition vary with a particular type of curable organic resin composition used. For the heat cure type, the composition may be cured at a temperature of 60 to 200° C. For the room temperature cure type, the composition may be cured at a temperature of 20 to 60° C.

Once the curable organic resin composition is cured, the unreacted resist layer remaining on the semiconductor component substrate is removed using a solvent. This is step (4). The solvent used herein is not particularly limited as long as it can dissolve the residual resist layer, but not the cured resin layer that covers the circuit region. Typical solvents are methanol, isopropyl alcohol and acetone.

After the resist layer is removed, the semiconductor component substrate is preferably dried for improving bond strength and cured properties. Drying conditions include a temperature of 80 to 200° C., preferably 100 to 180° C. and a time of 30 minutes to 4 hours, preferably 30 minutes to 2 hours.

Figure 14A:
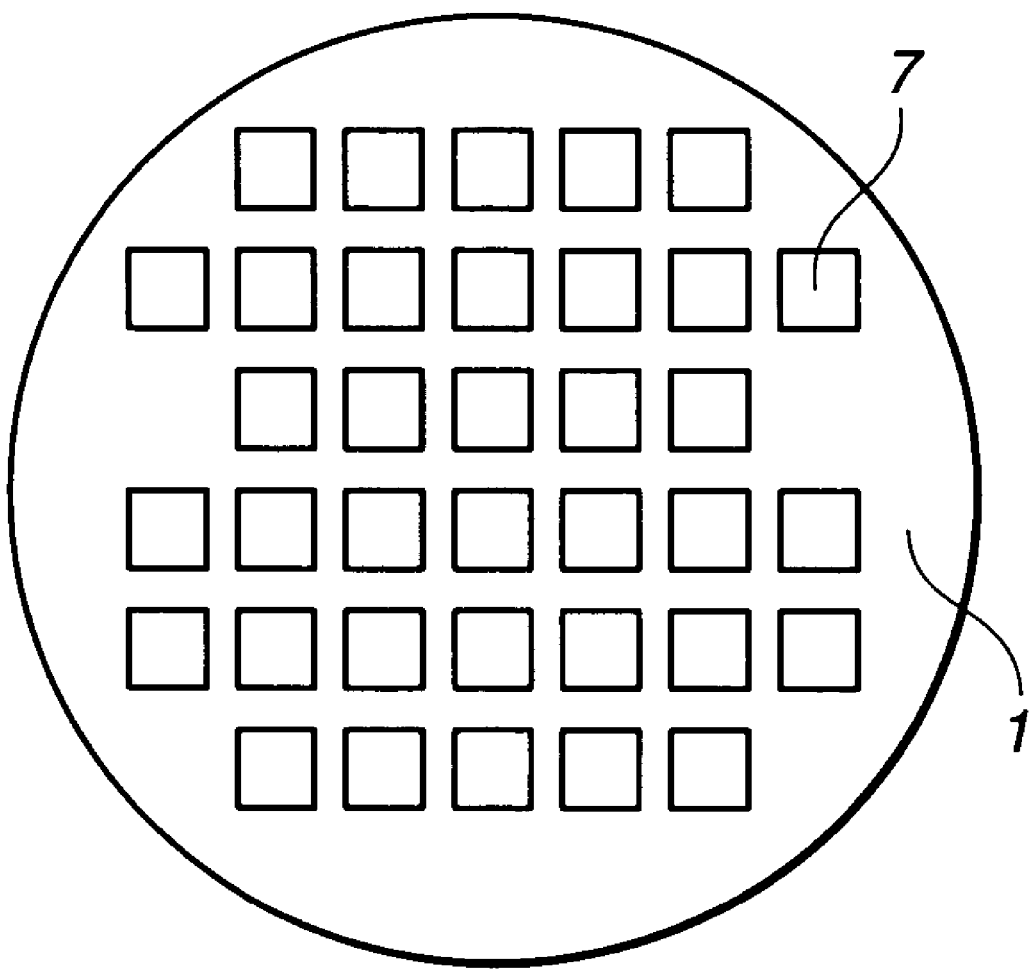
FIG. 14 illustrates an exemplary semiconductor component substrate sealed with an organic resin sealant, FIG. 14A being a plan view and FIG. 14B being a cross-sectional view.
Figure 14B:
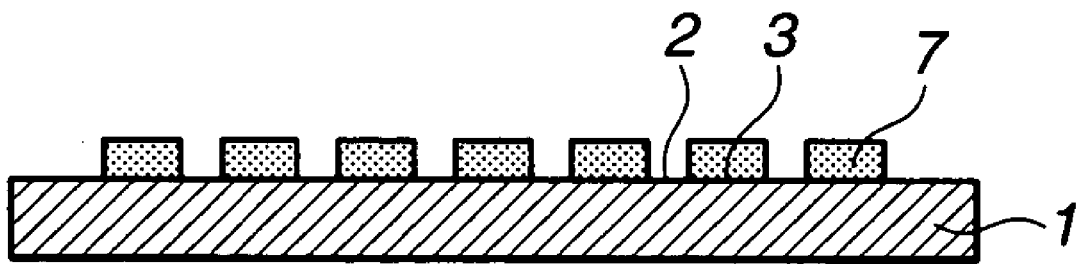

The foregoing method results in a structure as shown in FIG. 14 in which selected portions of a substrate 1 are sealed with an organic resin sealant 7.

In an embodiment wherein the semiconductor component has a plurality of circuit regions and electrodes formed thereon and each circuit region is resin-sealed as described above, the resin-sealed semiconductor component substrate resulting from step (4) is cut into discrete chips each bearing an individual resin-sealed circuit region. This is done, for example, by attaching the resin-sealed semiconductor component substrate to a dicing tape, and dicing the substrate along regions outside the sealed regions by means of a dicing saw, for separating into discrete individual sealed devices.

The sealed device obtained by the inventive method can be mounted on a package using a die bonding agent. After mounting, the electrodes extending from the semiconductor component are connected to the package using gold wires and optionally, another resin is potted into the package or a lid of ceramics or the like is bonded to the package with an adhesive. In this way, a semiconductor device is completed.

In an embodiment wherein the semiconductor component is an optical device like LED, the package can be completed by bonding a transparent glass lid with an adhesive, or by potting a transparent resin such as a silicone or epoxy resin.

In a further embodiment wherein an sealed device having an LED or light-emitting element built therein is mounted on a substrate in the flip-chip mode, the sealed device is separated into discrete individual chips. Alternatively, prior to separation into discrete chips, contact pads such as solder balls are attached to electrodes on a semiconductor component or semiconductor component substrate and thereafter, the sealed device is connected via solder balls to an organic substrate (such as optical/electronic hybrid substrate) or package. In this way, the semiconductor component sealed with a light-transmissive resin can be easily mounted.

According to the invention, an optical semiconductor device which can be mounted on an optical/electronic hybrid substrate is readily sealed as described above. Also, an LED can be sealed with an organic resin composition containing a phosphor and a light scattering agent in order to produce white light, so that the LED is readily assembled.

According to the invention, using an organic resin sealant, which could not be used in the prior art, such as a silicone resin composition which cures by heat or condensation reaction, only the semiconductor component circuit region at the wafer level can be sealed and protected to a high precision.

EXAMPLE

An example of the invention is described with reference to the drawings. FIGS. 1 to 7 illustrate the semiconductor component sealing method of the invention.

FIG. 1 is a schematic cross-sectional view of one exemplary semiconductor component substrate used in the invention. On the substrate 1, a plurality of circuit regions 3 and electrodes 2 connected thereto had been formed.

Figure 2:
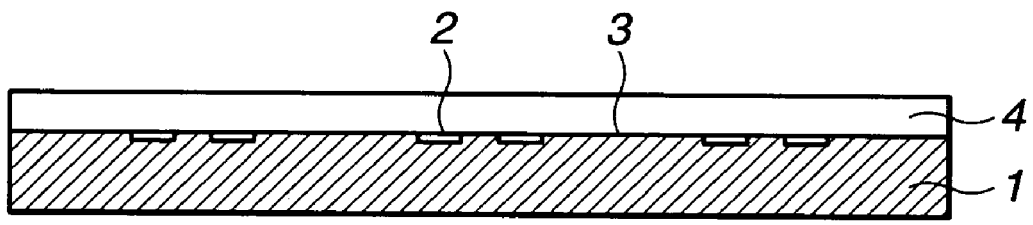
FIG. 2 is a schematic cross-sectional view of the substrate on which a resist layer is formed.

A positive resist material SIPR-9271 (Shin-Etsu Chemical Co., Ltd.) was applied onto the surface of the semiconductor substrate 1 by using a spin coater at 2,000 rpm, forming a resist layer 4 of 20 μm thick on the substrate 1 as shown in FIG. 2.

Figure 3:
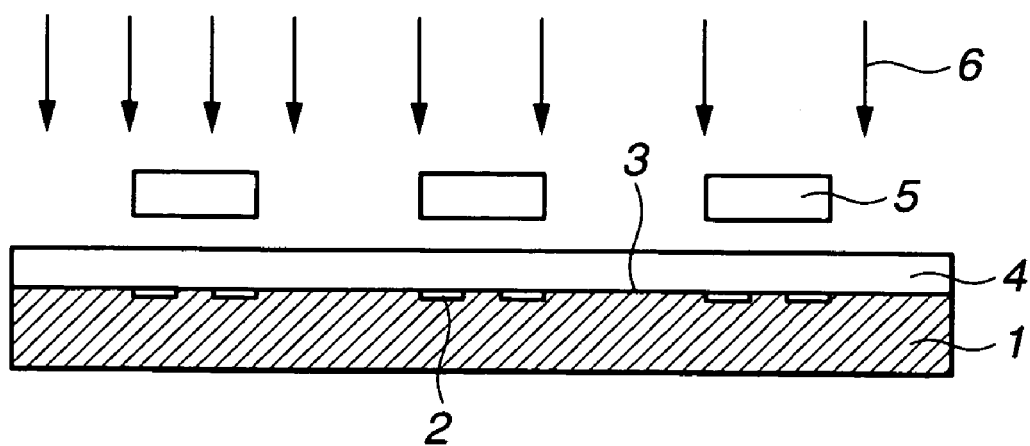
FIG. 3 is a schematic cross-sectional view illustrating the step of light exposure.

As shown in FIG. 3, a photomask 4 in which light-shielding zones of 3 mm×2 mm were spaced apart at intervals (light-transmissive zones) of 0.5 mm was placed over the substrate 1. Light 6 was illuminated through the photomask 4 whereby only those portions of the resist layer 4 corresponding to the circuit regions 3 were exposed. The light wavelength was 365 nm and the illumination time was 30 seconds.

It is noted that the semiconductor component substrate used herein has contact pads (electrodes), to which gold wires are to be connected, at the periphery of each circuit region. The region to be sealed with an organic resin sealant is the region where the contact pads are absent. Thus the photomask used had a light-transmissive zone in alignment with this region.

Figure 4:
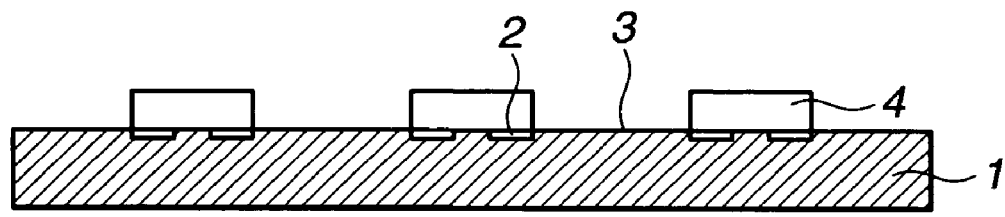
FIG. 4 is a schematic cross-sectional view of the substrate from which the selected portions of the resist have been removed.

Following light exposure, development with a liquid developer (typically a 2.4% solution of tetramethylammonium hydroxide) was carried out by the puddling technique whereby only the exposed portions of the resist layer were removed. The development step resulted in the semiconductor component substrate, as shown in FIG. 4, in which the resist layer 4 was removed only in those portions where an organic resin sealant was to be cast.

Figure 5:
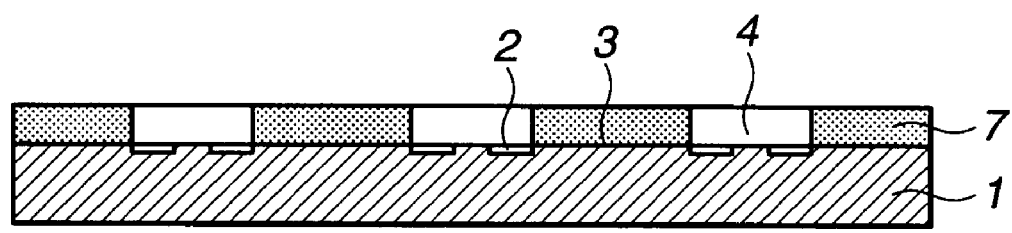
FIG. 5 is a schematic cross-sectional view of the substrate on which an organic resin sealant is applied.

Next, as shown in FIG. 5, the semiconductor component substrate 1 was set on a spin coater. While rotating the substrate at 2,000 rpm, a thermosetting liquid silicone resin composition 7 was coated to a build-up of 20 μm. The liquid silicone resin composition used herein contained 50 parts by weight of a polysiloxane having the formula:

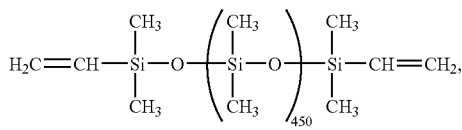

50 parts by weight of a vinylmethylsiloxane (VMQ) of resin structure consisting of 50 mol % $SiO_2$ units, 42.5 mol % $(CH_3)_3SiO_{1/2}$ units and 7.5 mol % $(CH_2{=}CH)(CH_3)_2SiO_{1/2}$ units, 10 parts by weight of an organohydrogenpolysiloxane having the formula:

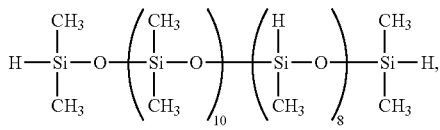

and 0.05 part by weight of an octyl alcohol-modified chloroplatinic acid solution, which were thoroughly stirred.

After the liquid silicone resin composition was coated, it was cured by heating at 150° C. for one hour.

Figure 6:
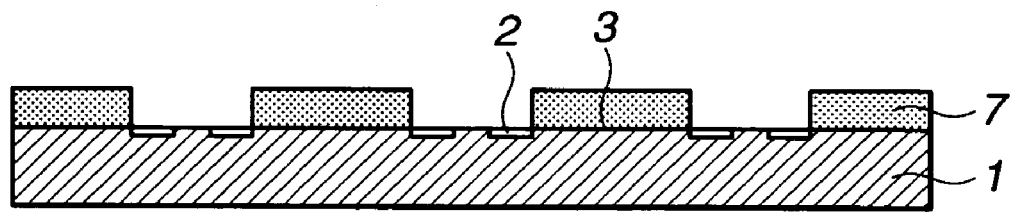
FIG. 6 is a schematic cross-sectional view of the substrate from which the residual resist has been removed.

After curing, the semiconductor component substrate 1 was immersed in an acetone solution whereby the residual resist was dissolved away as shown in FIG. 6. After acetone washing, the semiconductor component substrate 1 locally sealed with the organic resin sealant 7 was dried at 150° C. for one hour.

Figure 7:
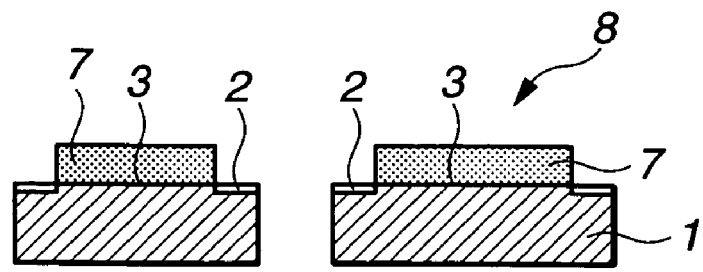
FIG. 7 is a schematic cross-sectional view of discrete sealed devices diced from the sealed substrate.

After drying, the semiconductor component substrate 1 was attached to a dicing tape. Using a dicing saw, the substrate was cut along lines where the organic resin sealant was absent, for separating into discrete individual sealed chips 8 each containing one circuit region 3 and electrodes 2 connected thereto as shown in FIG. 7.

Figure 8:
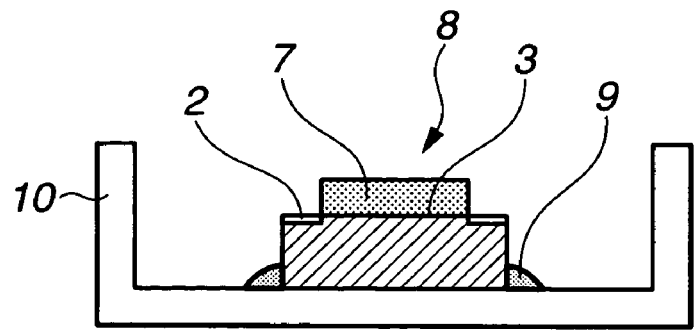
FIG. 8 is a schematic cross-sectional view of a package to which an sealed device is die bonded.

Then the discrete sealed chip 8 was mounted on an organic substrate or package 10 using an epoxy die bonding agent 9 as shown in FIG. 8.

Figure 9:
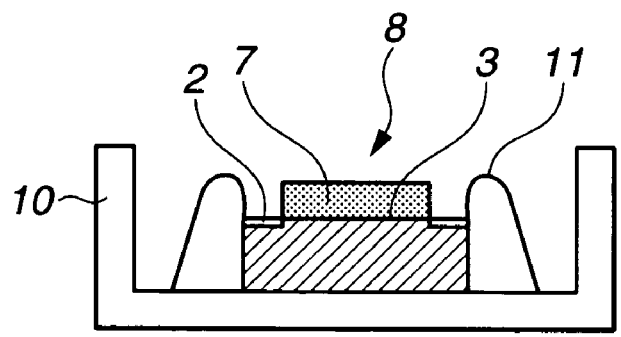
FIG. 9 is a schematic cross-sectional view of the package of FIG. 8 in which the sealed device is wire bonded to the package substrate.
Figure 10:
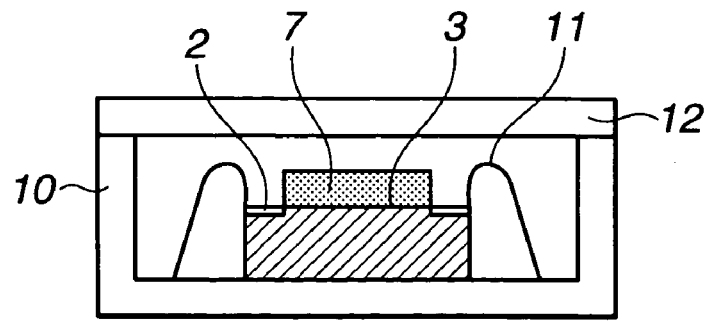
FIG. 10 is a schematic cross-sectional view of the package of FIG. 9 which is closed with a glass lid.
Figure 11:
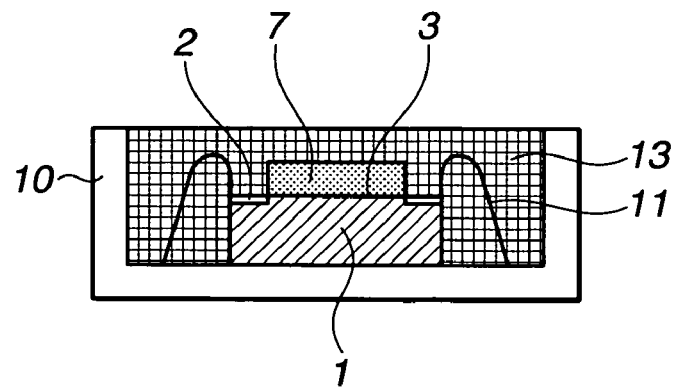
FIG. 11 is a schematic cross-sectional view of the package of FIG. 9 into which a resin is potted.

After mounting, gold wires 11 were applied to provide connections between the sealed chip 8 and the organic substrate 10 as shown in FIG. 9. Thereafter, the package was completed by bonding a transparent glass lid 12 to the organic substrate 10 with an adhesive as shown in FIG. 10. Alternatively, after the gold wire connection, the package was completed by potting a silicone resin as shown in FIG. 11.

Figure 12:
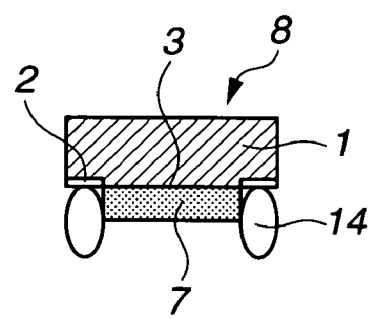
FIG. 12 is a schematic cross-sectional view of the sealed device which is formed with bumps.
Figure 13:
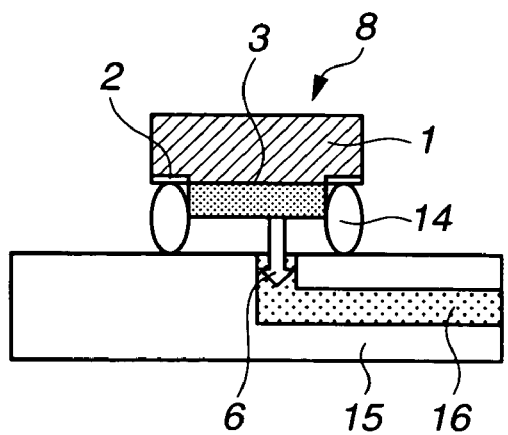
FIG. 13 is a schematic cross-sectional view of the sealed device which is mounted on a substrate with the aid of bumps.

In an embodiment wherein the sealed chip has an LED or light-emitting device (e.g., laser) built therein, after separation into individual chips, solder balls 14 are applied to the electrodes on the semiconductor component substrate 1 as shown in FIG. 12. Thereafter, the sealed chip 8 is connected to an optical/electronic hybrid substrate 15 through the solder balls 14 as shown in FIG. 13. A resin-sealed semiconductor device capable of transmitting light 6 to an optical waveguide 16 could be mounted in this way.

According to the invention, using an organic resin sealant having heat resistance, transparency and good adhesion, which could not be used in the prior art, such as a silicone resin composition which cures by heat or condensation reaction, only the circuit region at the wafer level can be sealed and protected to a high precision.

Japanese Patent Application No. 2003-194402 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for sealing a semiconductor component comprising a substrate and at least one circuit region and electrodes formed on a surface thereof the circuit region being sealed with a resin, the method comprising the steps of:
    (1) applying a resist material onto the substrate surface where the circuit and electrodes are formed, to form a resist layer,
    (2) selectively exposing the resist layer to radiation and developing the resist layer with a liquid developer such that only the portion of the resist layer which overlies the circuit region is removed,
    (3) applying a resin sealant onto the circuit region which is exposed as a result of selective removal of the resist layer and curing the resin sealant into a cured resin layer that covers the circuit region, and
    (4) removing the residual resist layer using a solvent which can dissolve the resist, but not the cured resin layer.

2. The sealing method of claim 1, wherein the resist material is a positive resist material so that only an exposed portion of the resist layer becomes dissolvable with the developer.

3. The sealing method of claim 1, wherein the resist material is a negative resist material so that only an unexposed portion of the resist layer is dissolvable with the developer.

4. The sealing method of claim 1, wherein the semiconductor component has a plurality of circuit regions and electrodes formed thereon, and after step (4), the substrate is cut into discrete chips each bearing an individual resin-sealed circuit region.

5. The sealing method of claim 1, wherein the resin sealant is a silicone or epoxy resin composition.

6. The sealing method of claim 1, wherein the resin sealant contains an inorganic phosphor and/or a light scattering agent.

7. The sealing method of claim 1, wherein the resin sealant is transparent.

8. The sealing method of claim 1, wherein the resist material has a thickness of about 5 to 100 μm.

9. The sealing method of claim 1, wherein the radiation in step (2) has a wavelength of less than about 400 nm.

10. The sealing method of claim 1, wherein the resin sealant is a heat-curable silicone resin.

11. The sealing method of claim 1, wherein the resin sealant is a heat-curable silicone resin is produced by a process wherein a vinyl-containing organoplysiloxane is reacted with a hydrosilyl-containing organopolysiloxane in the presence of a platinum catalyst.

12. The sealing method of claim 1, wherein the resin sealant is a heat-curable silicone resin is curable at room temperature.

13. The sealing method of claim 1, wherein the curing in step (3) is conducted at a temperature of from 60 to 200° C.

14. The sealing method of claim 1, wherein the solvent is selected from the group consisting of methanol, isopropyl alcohol, acetone and mixtures thereof.

* * * * *